(12) United States Patent
Abe et al.

(10) Patent No.: US 10,647,039 B2
(45) Date of Patent: May 12, 2020

(54) CASING COMPONENT, ELECTRONIC APPARATUS, AND MANUFACTURING METHOD FOR A CASING COMPONENT

(71) Applicant: SONY CORPORATION, Tokyo (JP)

(72) Inventors: Atsuhiro Abe, Kanagawa (JP); Fujio Kobayashi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/544,168

(22) PCT Filed: Oct. 29, 2015

(86) PCT No.: PCT/JP2015/005439
§ 371 (c)(1),
(2) Date: Jul. 17, 2017

(87) PCT Pub. No.: WO2016/125212
PCT Pub. Date: Aug. 11, 2016

(65) Prior Publication Data
US 2018/0009143 A1 Jan. 11, 2018

(30) Foreign Application Priority Data

Feb. 3, 2015 (JP) ................................. 2015-019705

(51) Int. Cl.
*H05K 5/00* (2006.01)
*B29C 45/16* (2006.01)
(Continued)

(52) U.S. Cl.
CPC ............ *B29C 45/1679* (2013.01); *B32B 3/10* (2013.01); *B32B 3/266* (2013.01); *B32B 7/12* (2013.01);
(Continued)

(58) Field of Classification Search
None
See application file for complete search history.

(56) References Cited

U.S. PATENT DOCUMENTS

| | | | | |
|---|---|---|---|---|
| 4,769,100 A | * | 9/1988 | Short | B29C 51/16 156/212 |
| 4,976,896 A | * | 12/1990 | Short | B29C 51/14 264/1.34 |
| 5,118,372 A | * | 6/1992 | Spahn | B29C 51/14 156/160 |
| 6,175,493 B1 | * | 1/2001 | Gold | G06F 1/203 174/15.2 |
| 6,858,287 B2 | * | 2/2005 | Fields | B32B 3/10 428/156 |
| 7,144,612 B2 | * | 12/2006 | LaFave | B29C 47/0021 428/31 |

(Continued)

FOREIGN PATENT DOCUMENTS

| | | |
|---|---|---|
| JP | 10-123081 A | 5/1998 |
| JP | 2004-1433 A | 1/2004 |

(Continued)

OTHER PUBLICATIONS

International Search Report and Written Opinion of PCT Application No. PCT/JP2015/005439, dated Feb. 2, 2016, 02 pages of English Translation and 06 pages of ISRWO.

(Continued)

*Primary Examiner* — Courtney L Smith
*Assistant Examiner* — Rashen E Morrison
(74) *Attorney, Agent, or Firm* — Chip Law Group

(57) ABSTRACT

A casing component according to an embodiment of the present technology includes a decorating film and a casing part. The decorating film is formed on a base film by vapor deposition and includes a metal layer, fine cracks being formed in the metal layer by stretching the base film. The casing part has a decorated region, the decorating film being adhered to the decorated region.

6 Claims, 13 Drawing Sheets

(51) Int. Cl.
    *H05K 5/02*      (2006.01)
    *B32B 3/10*      (2006.01)
    *B32B 33/00*     (2006.01)
    *B32B 7/12*      (2006.01)
    *B32B 27/36*     (2006.01)
    *B32B 3/26*      (2006.01)
    *B32B 27/08*     (2006.01)
    *B32B 15/08*     (2006.01)
    *C23C 14/58*     (2006.01)
    *H05K 5/04*      (2006.01)
    *B29K 101/12*    (2006.01)
    *B29L 31/34*     (2006.01)
    *C23C 14/20*     (2006.01)

(52) U.S. Cl.
    CPC .............. *B32B 15/08* (2013.01); *B32B 27/08* (2013.01); *B32B 27/36* (2013.01); *B32B 33/00* (2013.01); *C23C 14/5886* (2013.01); *H05K 5/0086* (2013.01); *H05K 5/02* (2013.01); *H05K 5/0243* (2013.01); *H05K 5/04* (2013.01); *B29K 2101/12* (2013.01); *B29L 2031/3481* (2013.01); *B32B 2255/10* (2013.01); *B32B 2255/205* (2013.01); *B32B 2307/514* (2013.01); *B32B 2307/518* (2013.01); *B32B 2451/00* (2013.01); *B32B 2457/00* (2013.01); *B32B 2457/208* (2013.01); *B32B 2571/00* (2013.01); *C23C 14/20* (2013.01)

(56) References Cited

U.S. PATENT DOCUMENTS

| 8,062,451 | B2* | 11/2011 | Mozer | B29C 66/8266 |
| | | | | 156/160 |
| 2009/0185340 | A1* | 7/2009 | Ji | B29C 45/14786 |
| | | | | 361/679.21 |
| 2018/0009143 | A1* | 1/2018 | Abe | B29C 45/1679 |

FOREIGN PATENT DOCUMENTS

| JP | 2004-001433 A | 1/2004 |
| JP | 2005-264254 A | 9/2005 |
| JP | 2007-030249 A | 2/2007 |
| JP | 2007-30249 A | 2/2007 |
| JP | 2009-286082 A | 12/2009 |
| JP | 2010-005999 A | 1/2010 |
| JP | 2010-214790 A | 9/2010 |
| JP | 2010-251899 A | 11/2010 |
| WO | 2011/024756 A1 | 3/2011 |

OTHER PUBLICATIONS

Office Action for JP Patent Application No. 2016-572944, dated Jan. 22, 2019, 8 pages of Office Action and 5 pages of English Translation.

Office Action for CN Patent Application No. 201580074634.4, dated May 5, 2019, 11 pages of Office Action and 09 pages of English Translation.

Office Action for JP Patent Application No. 2016-572944, dated Jul. 16, 2019, 06 pages of Office Action and 04 pages of English Translation.

* cited by examiner

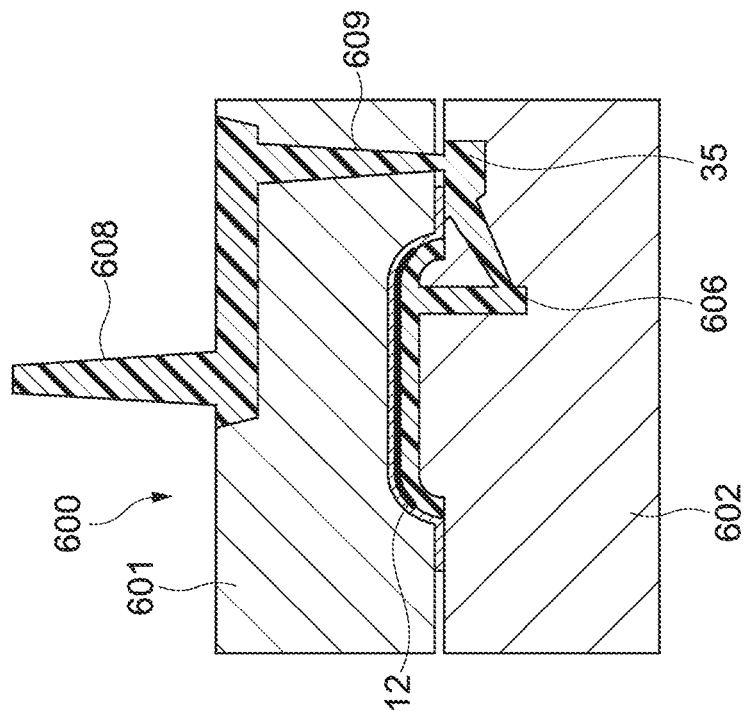
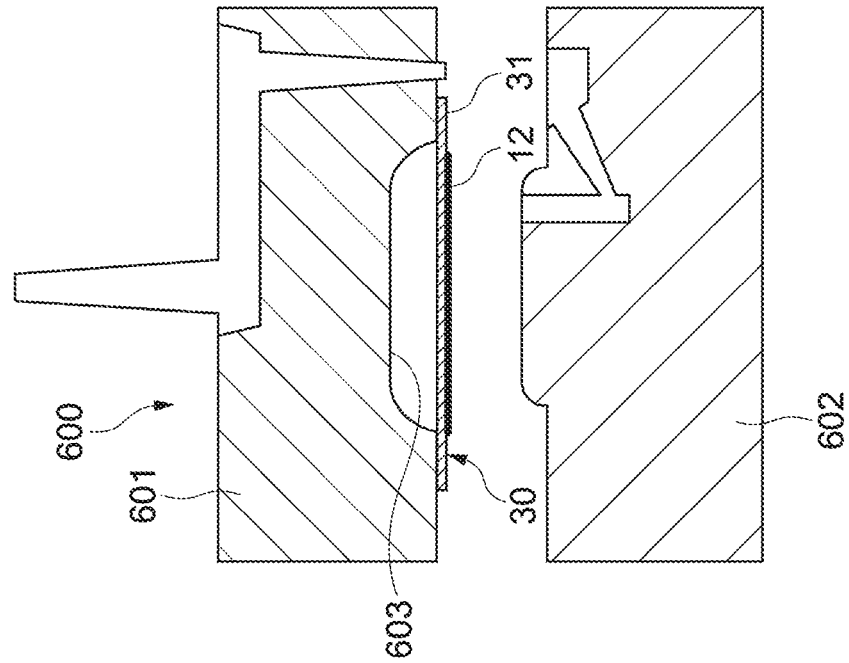

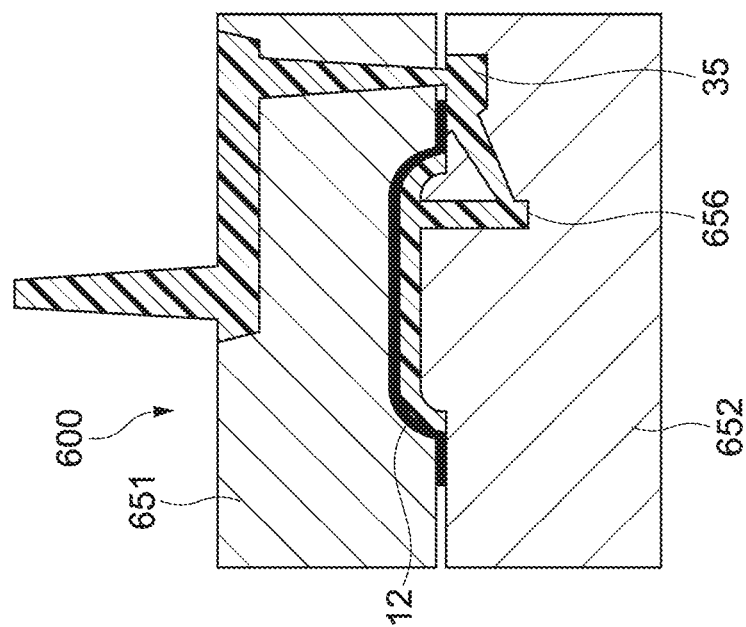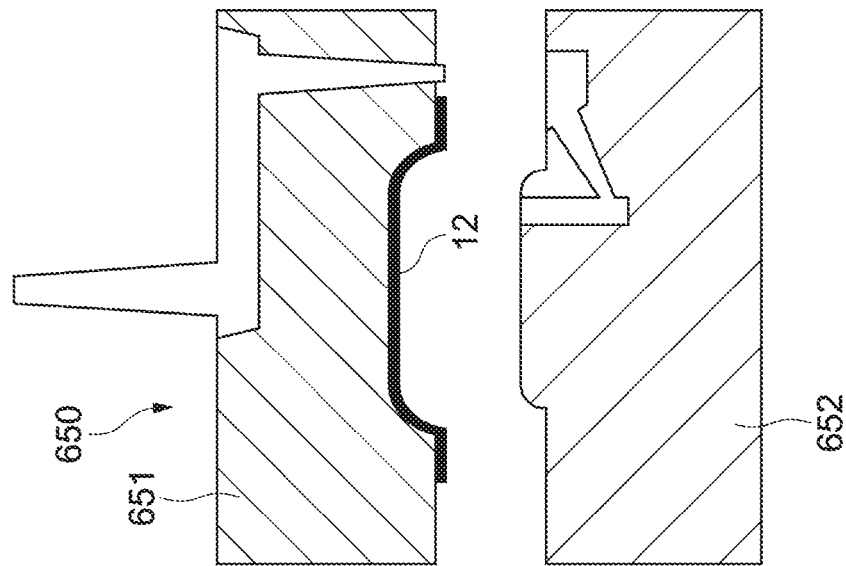

FIG. 10A

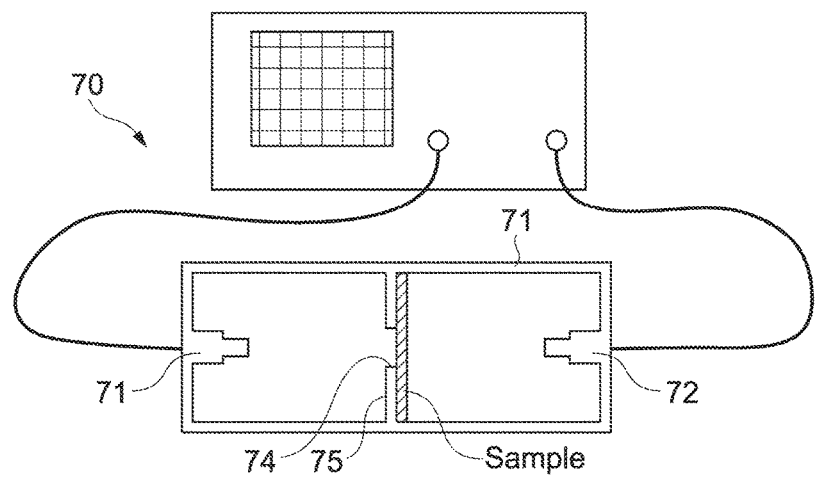

FIG. 10B

| Film configuration | Stretching percentage (%) | Outer appearance | Crack size X, Y (μm) | Surface resistance (Ω/cm) | Radio wave attenuation 2.45GHz (dB) |
|---|---|---|---|---|---|
| 1. Co20nm | x0, y0 | Dark metallic | None | 22 | -9.3 |
| 2. Co20nm | x2.6, y3.1 | Dark metallic | 10, 10 | ∞ | -0.5 |
| 3. Al64nm | x4.0, y3.6 | Al metallic | 15, 15 | ∞ | -0.1 |
| 4. Co23nm+Al15nm | x3.3, y1.8 | Dark metallic | 15, 15 | ∞ | -1.4 |
| 5. Ti70nm+TiO$_2$50nm | x4.3, y2.7 | Blue metallic | 100, 30 | ∞ | -0.4 |
| 6. Ti70nm+TiO$_2$105nm | x5.0, y3.1 | Gold metallic | 200, 50 | ∞ | -0.2 |
| 7. Ti70nm+TiO$_2$240nm | x2.6, y3.1 | Green metallic | 100, 50 | ∞ | -0.5 |
| 8. Ti70nm+TiO$_2$295nm | x3.6, y2.7 | Purple metallic | 100, 30 | ∞ | -0.8 |

23(Sample 2)

(100μm/1div)

CASING COMPONENT, ELECTRONIC APPARATUS, AND MANUFACTURING METHOD FOR A CASING COMPONENT

CROSS REFERENCE TO RELATED APPLICATIONS

This application is a U.S. National Phase of International Patent Application No. PCT/JP2015/005439 filed on Oct. 29, 2015, which claims priority benefit of Japanese Patent Application No. JP 2015-019705 filed in the Japan Patent Office on Feb. 3, 2015. Each of the above-referenced applications is hereby incorporated herein by reference in its entirety.

TECHNICAL FIELD

The present technology relates to a casing component applicable to an electronic apparatus, an electronic apparatus to which the casing component is applied, and a manufacturing method for the casing component.

BACKGROUND ART

Conventionally, a member that is capable of transmitting an electromagnetic wave such as a millimeter wave therethrough while having a metal-like outer appearance is devised as a casing component of an electronic apparatus or the like. For example, Patent Literature 1 discloses an exterior component for loading an automobile radar on an emblem of an automobile. For example, indium is deposited on a resin film and this film is attached to the surface layer of the emblem by an insert molding method. With this, it is possible to produce an exterior component that has an ornamentally metallic luster and has no absorption region in an electromagnetic frequency band due to the island structure of indium (paragraph 0006 of Patent Literature 1, etc.).

However, in the method of forming the island structure of indium, there is a problem that it is difficult to make a uniform film thickness on the whole in the case where the deposition area is large, for example. Further, there is also a problem that the island structure is easily broken due to the temperature of resin to be poured thereinto when forming the casing component (paragraphs 0007 and 0008 of Patent Literature 1, etc.).

In order to solve this problem, in Patent Literature 1, the following technology is disclosed. That is, a sea-island structure in which a metal region is regarded as an island and a non-metal region surrounding the island is regarded as a sea is artificially formed to have regularity. Then, each metal region is insulated with each other by the non-metal region, and the area of the metal region and the distance with an adjacent metal region are properly controlled. With this, a material that has electromagnetic wave transmission properties comparable to those of a film on which indium is deposited can be obtained (paragraph 0013 of Patent Literature 1, etc.).

CITATION LIST

Patent Literature

Patent Literature 1: Japanese Patent Application Laid-open No. 2010-251899

DISCLOSURE OF INVENTION

Technical Problem

As described above, the technology for producing a casing component that is capable of transmitting a radio wave therethrough and has high designability while having metallic luster is desired.

In view of the circumstances, it is an object of the present technology to provide a casing component that is capable of transmitting a radio wave therethrough and has high designability while having a metal-like outer appearance, an electronic apparatus to which the casing component is applied, and a manufacturing method for the casing component.

Solution to Problem

In order to achieve the above-mentioned object, a casing component according to an embodiment of the present technology includes a decorating film and a casing part.

The decorating film includes a metal layer, the metal layer being formed on a base film by vapor deposition, fine cracks being formed in the metal layer by stretching the base film.

The casing part has a decorated region, the decorating film being adhered to the decorated region.

In this casing component, the decorating film including the metal layer is bonded to the decorated region of the casing part. The metal layer is formed on the base film by vapor deposition. In the metal layer, fine cracks are formed by stretching of the base film. With this, the selection range of the metal material constituting the metal layer is spread, and it is possible to realize a casing component that is capable of transmitting a radio wave therethrough and has high designability while having a metal-like outer appearance.

The decorating film may include a base film in which the metal layer is formed.

Because fine cracks are formed by stretching of the base film, it is possible to form the metal layer on the base film with high adhesion. As a result, it is possible to improve the durability of the decorated region decorated by the decorating film including the base film.

The fine cracks may be formed by performing biaxial stretching on the base film.

With this, it is possible to easily form fine cracks.

The metal layer may have a restriction structure that restricts stretchability.

With this, it is possible to use a metal material having high stretchability and improve the designability.

The restriction structure may be a structure in which a metal material constituting the metal layer has a frost-column shape.

By causing the metal material to have a frost-column shape, it is possible to reduce the stretchability of the metal layer.

The metal layer may be formed on the base film by vacuum vapor deposition. In this case, the restriction structure may be formed by performing the vacuum vapor deposition under a predetermined temperature condition and a predetermined pressure condition.

By controlling the temperature condition and the pressure condition, it is possible to easily form a restriction structure.

The metal layer may be formed by performing vacuum vapor deposition on the base film transported along a peripheral surface of a rotating drum from an unwind roll to a take-up roll.

With the roll-to-roll system, it is possible to easily mass-produce the decorating film at low cost.

The metal layer may be formed of any of aluminum, titanium, and an alloy containing at least one of them.

It is possible to form the metal layer with these materials that are hard to form with wet plating and have high stretchability. With this, it is possible to improve the designability of the casing component.

The metal layer may have a laminate structure, a metal layer or an oxidized metal layer is laminated in the laminate structure.

With this, it is possible to reduce the stretchability of the metal layer and improve the designability of the casing component.

The metal layer may include a layer of any one of aluminum, aluminum oxide, titanium, titanium oxide, and an alloy containing at least one of them.

With this, it is possible to improve the designability of the casing component.

The fine cracks may be formed at a pitch of not less than 1 μm and not more than 500 μm.

With this, it is possible to exert sufficient radio wave transmission properties.

An electronic apparatus according to an embodiment of the present technology includes the decorating film; the casing part; and an electronic component housed in the casing part.

The electronic component may include an antenna unit disposed in the decorated region.

A manufacturing method for a casing component according to an embodiment of the present technology includes forming a metal layer on a base film by vapor deposition, and forming fine cracks in the metal layer by stretching the base film.

A decorating film including the metal layer in which the fine cracks are formed is formed.

A transfer film is formed by adhering a carrier film to the decorating film.

A molding part is formed so that the decorating film is transferred from the transfer film by an in-mold molding method or a hot stamping method.

A manufacturing method for a casing component according to another embodiment of the present technology includes forming a metal layer on a base film to be a carrier film by vapor deposition, and forming fine cracks in the metal layer by stretching the base film.

A transfer film including the base film and the metal layer is formed.

A molding part is formed so that the metal layer is transferred from the transfer film by an in-mold molding method or a hot stamping method.

A manufacturing method for a casing component according to another embodiment of the present technology includes forming a metal layer on a base film by vapor deposition, and forming fine cracks in the metal layer by stretching the base film.

A decorating film including the metal layer in which the fine cracks are formed is formed.

A molding part is integrally formed with the decorating film by an insert molding method.

The forming of the metal layer may include performing vacuum vapor deposition under a predetermined temperature condition and a predetermined pressure condition so that a metal material constituting the metal layer has a frost-column shape.

Advantageous Effects of Invention

As described above, in accordance with the present technology, it is possible to realize a casing component that is capable of transmitting a radio wave therethrough and has high designability while having a metal-like outer appearance. It should be noted that the effect described here is not necessarily limitative and may be any effect described in the present disclosure.

BRIEF DESCRIPTION OF DRAWINGS

FIGS. 8A and 8B The schematic diagrams for describing an in-mold molding method.

FIGS. 9A and 9B The schematic diagrams for describing an insert molding method.

FIGS. 10A and 10B The schematic diagrams for describing evaluation of radio wave transmission properties.

MODE(S) FOR CARRYING OUT THE INVENTION

Hereinafter, embodiments according to the present technology will be described with reference to the drawings.

[Configuration of Electronic Apparatus]

Figure 1A:
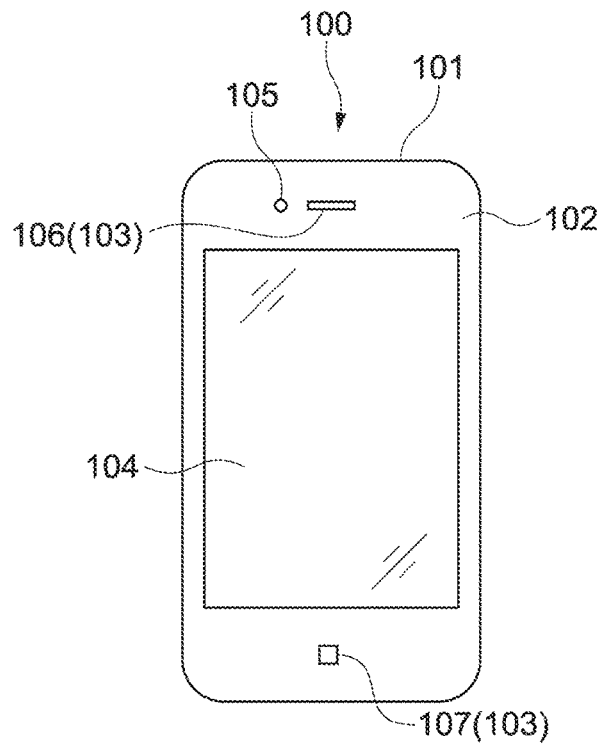
FIGS. 1A and 1B The schematic diagrams showing a configuration example of a portable terminal as an electronic apparatus according to an embodiment.
Figure 1B:
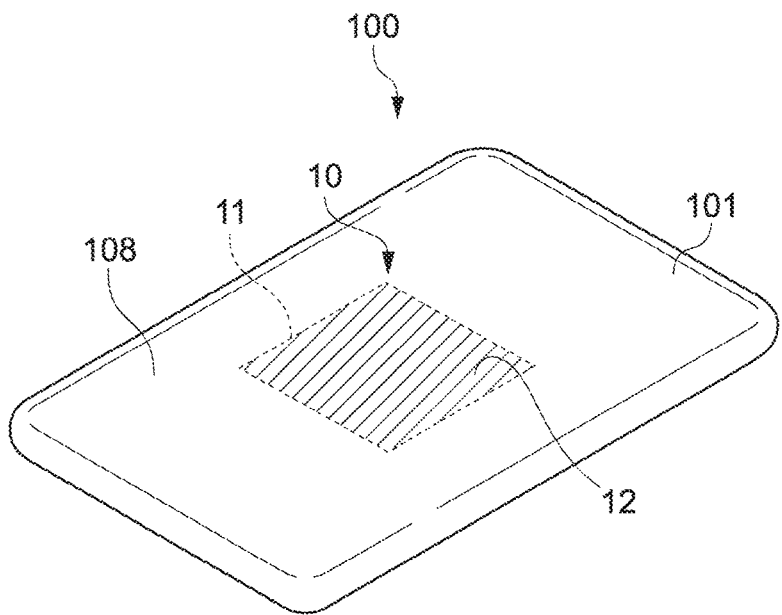

FIGS. 1A and 1B a are schematic diagrams showing a configuration example of a portable terminal as an electronic apparatus according to an embodiment of the present technology. FIG. 1A is a front view showing the front side of a portable terminal 100, and FIG. 1B is a perspective view showing the back side of the portable terminal 100.

The portable terminal 100 includes a casing part 101 and an electronic component (not shown) housed in the casing part 101. As shown part FIG. 1A, a call unit 103, a touch panel 104, and a facing camera 105 are provided to a front part 102 that is the front side of the casing part 101. The call unit 103 is provided to talk with the party on the phone and includes a speaker unit 106 and an audio input unit 107. The voice of the party is output from the speaker unit 106, and the voice of the user is transmitted to the party via the audio input unit 107.

On the touch panel 104, various images and GUI (Graphical User Interface) are displayed. The user is capable of viewing a still image or a moving image via the touch panel 104. Further, the user inputs various touch operations via the touch panel 104. The facing camera 105 is used when picking up an image of the face of the user, and the like. The specific configuration of each device is not limited.

As shown in part FIG. 1B, a metal decorating part 10 decorated to have a metal-like outer appearance is provided to a back part 108 that is the back side of the casing part 101. The metal decorating part 10 is capable of transmitting a radio wave therethrough while having a metal-like outer appearance.

Although described later in detail, a decorated region 11 is set to a predetermined region of the back part 108. A decorating film 12 according to the present technology is adhered to the decorated region 11, thereby configuring the metal decorating part 10. Therefore, the decorated region 11 is a region to which the metal decorating part 10 is to be provided. The casing part 101 including the decorated region 11 and the decorating film 12 to be adhered to the decorated region 11 constitute the casing component according to the present technology.

In the example shown in part FIG. 1B, the metal decorating part 10 is partially formed on the substantially central part of the back part 108. The position at which the metal decorating part 10 is formed is not limited and may be appropriately set. For example, the metal decorating part 10 may be formed on the entire back part 108. With this, it is possible to make the entire back part 108 have a constant metal-like outer appearance.

It is also possible to make the entire back part 108 have a constant metal-like an outer appearance by making other parts around the metal decorating part 10 have an outer appearance substantially similar to that of the metal decorating part 10. In addition, it is also possible to improve the designability by making parts other than the metal decorating part 108 have another outer appearance such as a wood-grain appearance. It only needs to appropriately set the position and size of the metal decorating part 10, the outer appearance of the other parts, and the like so that the user's desired designability is exerted.

As the electronic component housed in the casing part 101, in this embodiment, an antenna unit 15 (see FIG. 2) that is capable of communicating with an external reader/writer and the like via a radio wave is housed. The antenna unit 15 includes a base substrate (not shown), an antenna coil 16 formed on the base substrate (see FIG. 2), a signal processing circuit unit (not shown) electrically connected to the antenna coil 16, and the like. The specific configuration of the antenna unit 15 is not limited. Note that as the electronic component housed in the casing part 101, various electronic components such as an IC chip and a capacitor may be housed.

Figure 2:
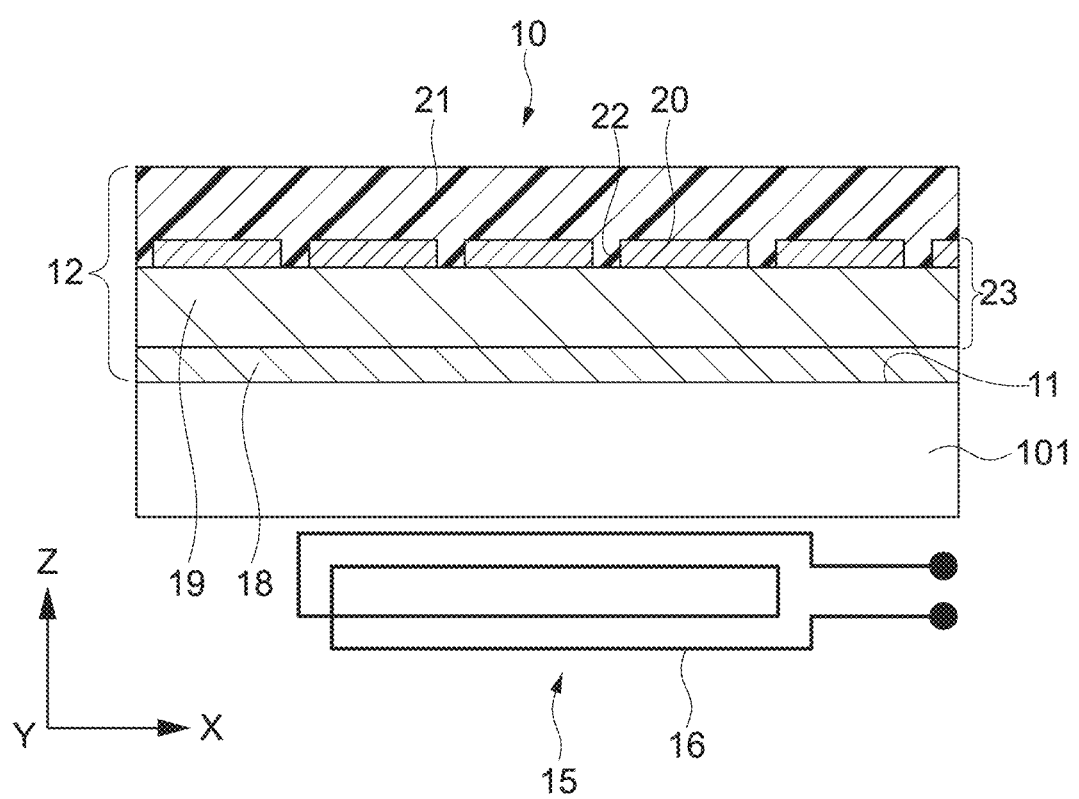
FIG. 2 A schematic cross-sectional view showing a configuration example of a metal decorating part shown in FIGS. 1A and 1B.

FIG. 2 is a schematic cross-sectional view showing a configuration example of the metal decorating part 10. As described above, the metal decorating part 10 includes the decorated region 11 set on the region depending on the position of the antenna unit 15 and the like, and the decorating film 12 to be adhered to the decorated region 11.

The decorating film 12 includes an adhesive layer 18, a base film 19, a metal layer 20, and a sealing resin 21. The adhesive layer 18 is a layer for adhering the decorating film 12 to the decorated region 11. The adhesive layer 18 is formed by applying an adhesive material to a surface opposite to the surface on which the metal layer 20 of the base film 19 is formed. The kind, applying method, and the like of the adhesive material are not limited.

The sealing resin 21 is formed of a transparent material, and functions as a protective layer that protects the base film 19 and the metal layer 20. The sealing resin 21 is formed by applying UV curing resin, thermosetting resin, two-component curing resin, or the like. By forming the sealing resin 21, for example, smoothing, antifouling, peeling prevention, scratch prevention, and the like are realized.

The base film 19 is formed of a material having stretchability, and a resin film is typically used as the base film 19. As the material of the base film 19, for example, PET (polyethylene terephthalate), acryl, or the like is used. Other materials may be used.

The metal layer 20 is formed to make the decorated region 11 have a metal-like outer appearance. The metal layer 20 is a layer formed in the base film 19 by vacuum vapor deposition, and many fine cracks (hereinafter, referred to as the fine cracks) 22 are formed.

The fine cracks 22 forms a plurality of discontinuous surfaces in the metal layer 20. Therefore, it is possible to sufficiently prevent an eddy current from being generated when a radio wave is applied to the casing part 101. As a result, it is possible to sufficiently prevent an electromagnetic wave energy from being reduced due to eddy current loss and high radio wave transmission properties are realized.

In this embodiment, when the decorating film 12 is formed, first, a luster film 23 including the base film 19 and the metal layer 20 is formed. After that, the adhesive layer 18 and sealing resin 21 are formed in the luster film 23. Note that the order of the formation of each layer is not limited thereto. Further, depending on the formation condition of the casing part 101 and the like, the adhesive layer 18 and sealing resin 21 are omitted in some cases. In this case, the luster film 23 is adhered to the decorated region 11, as the decorating film according to the present technology.

Figure 3A:
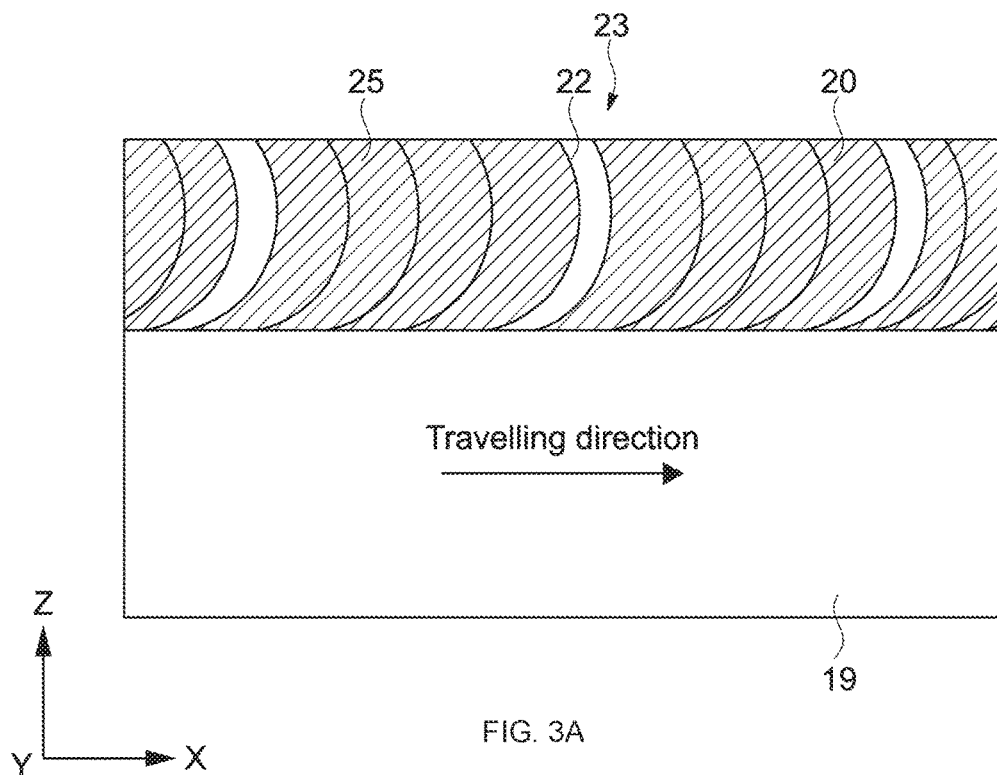
FIGS. 3A and 3B A schematic view showing a configuration example of a luster film formed of a base film and a metal layer.
Figure 3B:
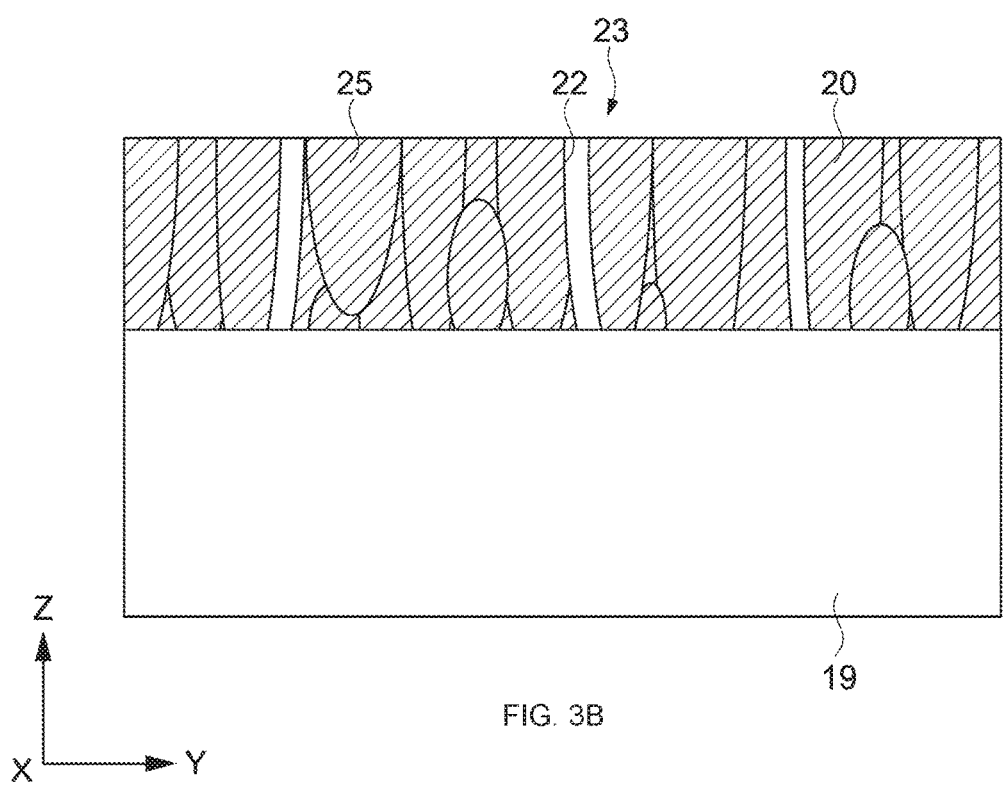

FIGS. 3A and 3B are an enlarged schematic view showing a configuration example of the luster film 23 formed of the base film 19 and the metal layer 20. Although described later, the luster film 23 is formed by performing vacuum vapor deposition in the state where the base film 19 is transported by a roll-to-roll system. FIG. 3A is a cross-sectional view in the case where an optical film is cut along the travelling direction (X direction in the figure) of the base film 19. FIG. 3B is a cross-sectional view in the case where the optical film is cut along the direction (Y direction in the figure) orthogonal to the travelling direction of the base film 19.

As shown in FIG. 3A and FIG. 3B, in this embodiment, the metal layer 20 is formed so that the metal material constituting the metal layer 20 has a frost-column shape. That is, many fine column structures in which fine particles of the metal material aggregate are formed on the base film 19 like frost columns. Hereinafter, when fine columns are each referred to as the fine column 25, there is a fine void (not shown) between the adjacent fine columns 25.

The frost-column structure corresponds to the restriction structure that suppresses the stretchability of the metal layer 20 in this embodiment. Note that such a structure can be expressed as a (fine) column structure or a fibrous structure.

As shown in FIG. 3A, the growth direction of fine particles is displaced as it is away from the base film 19 in the Z direction in each fine column 25 and each fine column 25 has a curved shape like a banana. The direction in which each fine column 25 is curved is substantially the same.

As shown in FIG. 3B, the size of the cross-section or position of each fine column 25 is varied. That is, a plurality of fine columns 25 are formed on the base film 19 at random positions. However, it is not limited thereto, and the plurality of fine columns 25 may be formed along the Y direction so as to be arranged on a substantially straight line.

The fine cracks 22 formed in the metal layer 19 are formed between the fine columns 25. The fine cracks 22 are formed by expanding the fine voids between the fine columns 25, and are sufficiently larger than the voids. The frost-column structure of the metal layer 20 and the fine cracks 22 can be sufficiently confirmed by observing the cross-section of the luster film 23.

Figure 4:
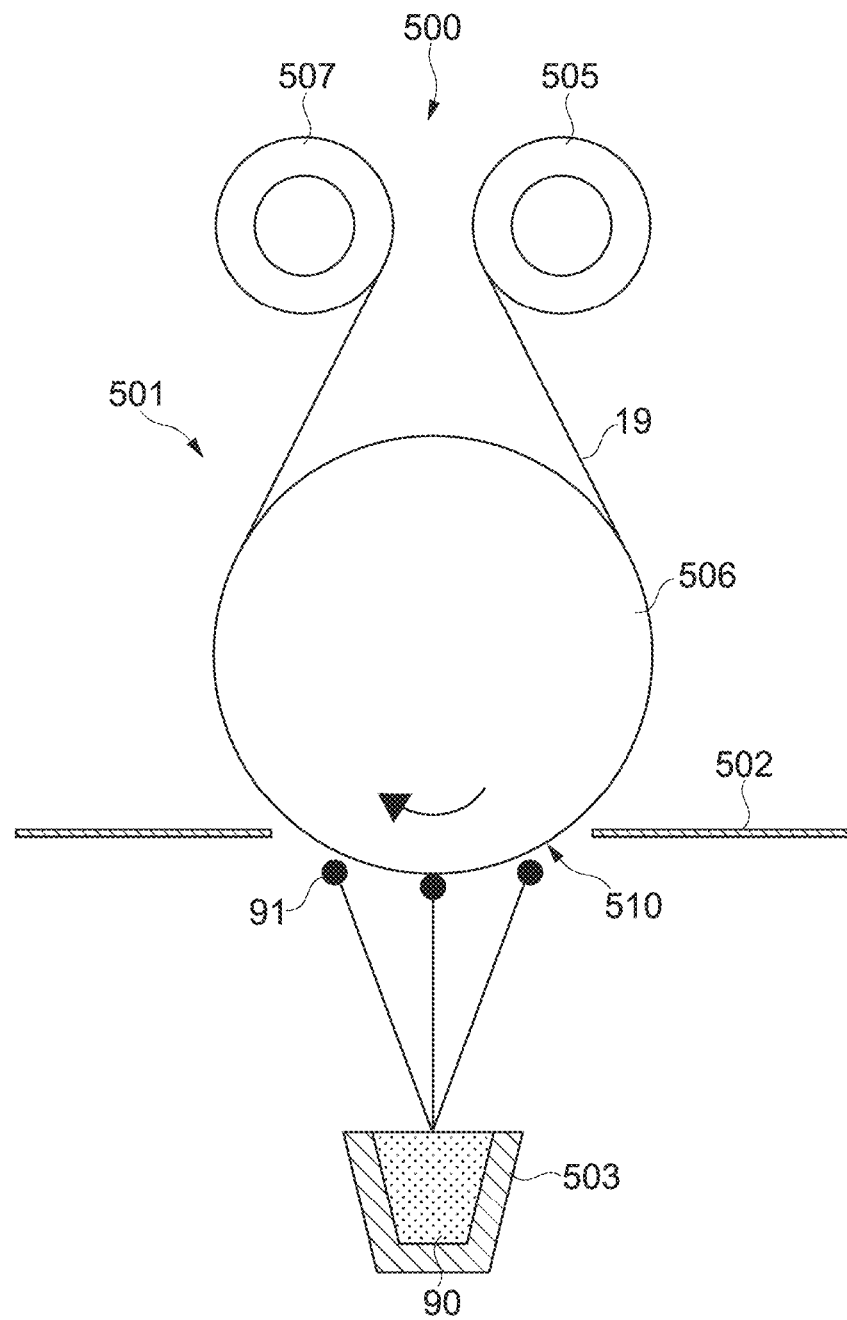
FIG. 4 A schematic view showing a configuration example of a vacuum deposition apparatus.

The method of forming the luster film 23 will be described. The luster film 23 is formed by vacuum vapor deposition and biaxial stretching. FIG. 4 is a schematic view showing a configuration example of a vacuum deposition apparatus. In this vacuum deposition apparatus 500, continuous vacuum vapor deposition by a roll-to-roll system can be performed.

The vacuum deposition apparatus 500 includes a film transport mechanism 501, a partition wall 502, a crucible 503, and a heat source (not shown) disposed in a vacuum chamber (not shown). The film transport mechanism 501 includes an unwind roll 505, a rotating drum 506, and a take-up roll 507. The base film 19 is transported from the unwind roll 505 to the take-up roll 507 along the peripheral surface of the rotating drum 506.

The crucible 503 is disposed at a position that faces the rotating drum 506. In the crucible 503, a metal material 90 constituting the metal layer 20 is housed. A region of the rotating drum 506 that faces the crucible 503 is a deposition region 510, and fine particles 91 of the metal material 90 are deposited on the base film 19 while being transported through the deposition region 510. The partition wall 502 restricts the fine particles 91 that travel at an angle toward regions other than the deposition region 510.

As the metal material 25, for example, a metal that has a high reflectance for visible light and a relatively low permeability (e.g., Al, Ti, Cr, Fe, Co, Ni, Cu, Zn, Ag, W, Ir, Au, Pt, Sn, or alloy containing these metals) or the like is used. As a matter of course, it is not limited thereto, and another metal material may be used. For example, the metal material 25 is appropriately selected taking into account the designability or cost of the material.

Although also the film thickness of the metal layer 20 is not limited, for example, it is deposited to have a thickness for substantially reflecting visible light (e.g., several nm to 100 nm). By forming the metal layer 20 to have a thickness of not less than approximately 10 nm, it is possible to exert a sufficiently high reflectance.

The base film 19 is transported while the rotating drum 506 is sufficiently cooled. The metal material 90 in the crucible 503 is heated by, for example, a heat source (not shown) such as a heater, a laser, and an electron gun. With this, vapor containing the fine particles 91 is generated from the crucible 503. Then, the fine particles 91 are deposited on the base film 19 that travels through the deposition region 510, thereby depositing the metal layer 20 on the base film 19. Note that the configuration of the vacuum deposition apparatus 500 is not limited.

Figure 5A:
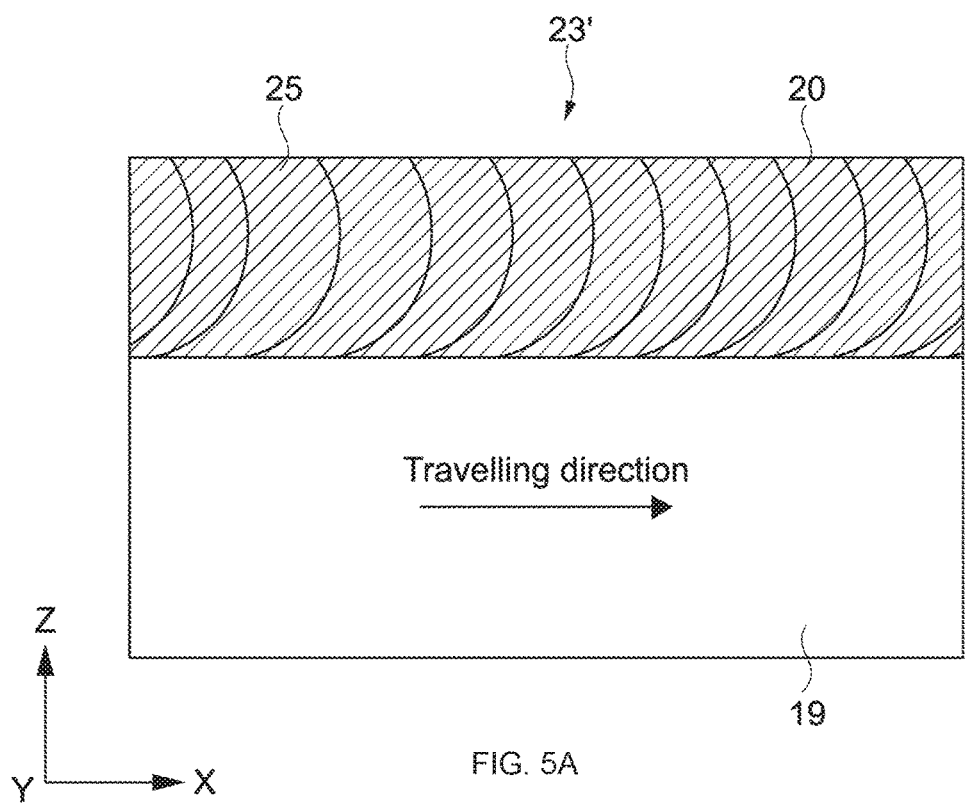
FIGS. 5A and 5B An enlarged view schematically showing the luster film before biaxial stretching after vacuum vapor deposition.
Figure 5B:
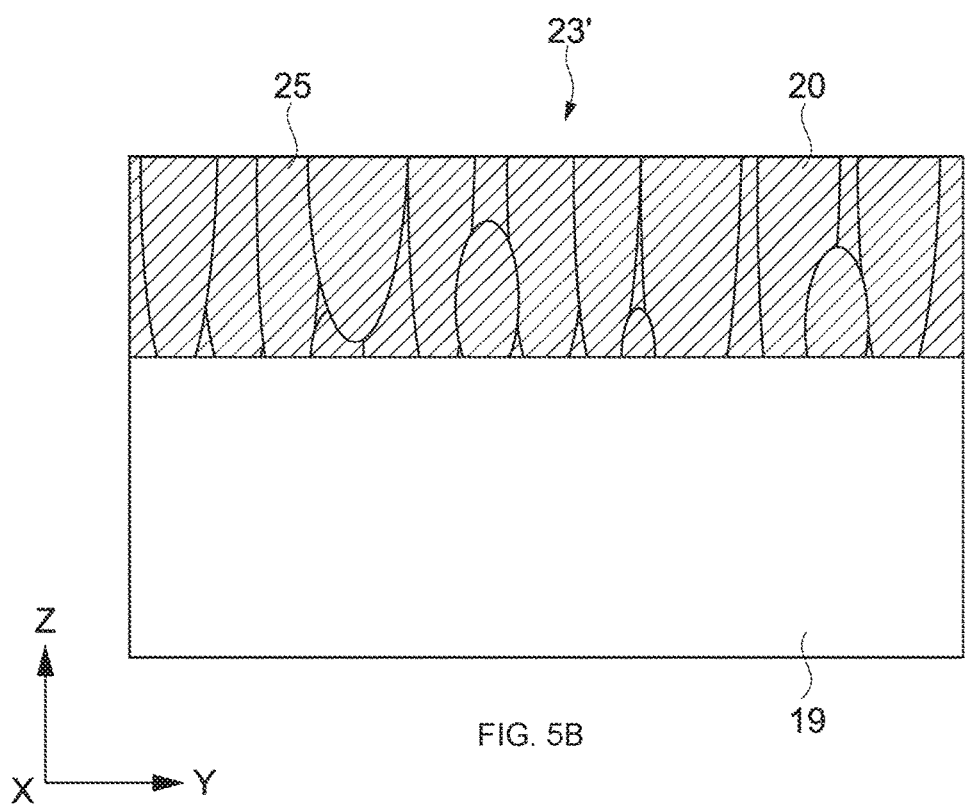

FIGS. 5A and 5B are enlarged views schematically showing a luster film 23' before biaxial stretching after vacuum vapor deposition. FIG. 5A is a cross-sectional view in the case where it is cut in the travelling direction of the base film 19, and FIG. 5B is a cross-sectional view in the case where it is cut in the direction orthogonal to the travelling direction. The luster film 23' shown in FIG. 5A and FIG. 5B is in the state before the fine cracks 22 are formed.

Right after entering the deposition region 510 shown in FIG. 4 and starting deposition, the fine particles 91 of the metal material 90 fly at a predetermined angle from the forward side of the travelling base film 19. As the base film 19 travels through the deposition region 510, the direction in which the metal particles 91 are deposited approaches the normal direction of the base film 19. Then, at the intermediate position of the deposition region 510, the fine particles 91 of the metal material 90 are deposited in the direction that is substantially the same as the normal direction of the base film 19.

When the base film 19 passes through the intermediate position of the deposition region 510, the fine particles 91 of the metal material 90 reach the base film 19 at a predetermined angle from the rear side of the base film 19. As the transportation of the base film 19 proceeds, the direction in which the fine particles 91 are deposited approaches the plane direction of the base film 19. As a result, the plurality of fine columns 25 having a curved shape like a banana are formed.

Further in this embodiment, the temperature condition and the pressure condition of vacuum vapor deposition are appropriately controlled so that the metal layer 20 has a frost-column structure. That is, the present inventor has found a suitable condition in which the plurality of fine columns 25 are formed in the base film 19 with sufficient adhesiveness. The condition is determined by the film temperature, the degree of vacuum, the deposition rate, the deposition material, and the like. In particular, the film temperature and the degree of vacuum significantly affect the condition. As a result of consideration taking into account this point, the frost-column structure according to the present technology can be realized by controlling the film temperature and the degree of vacuum.

Figure 6:
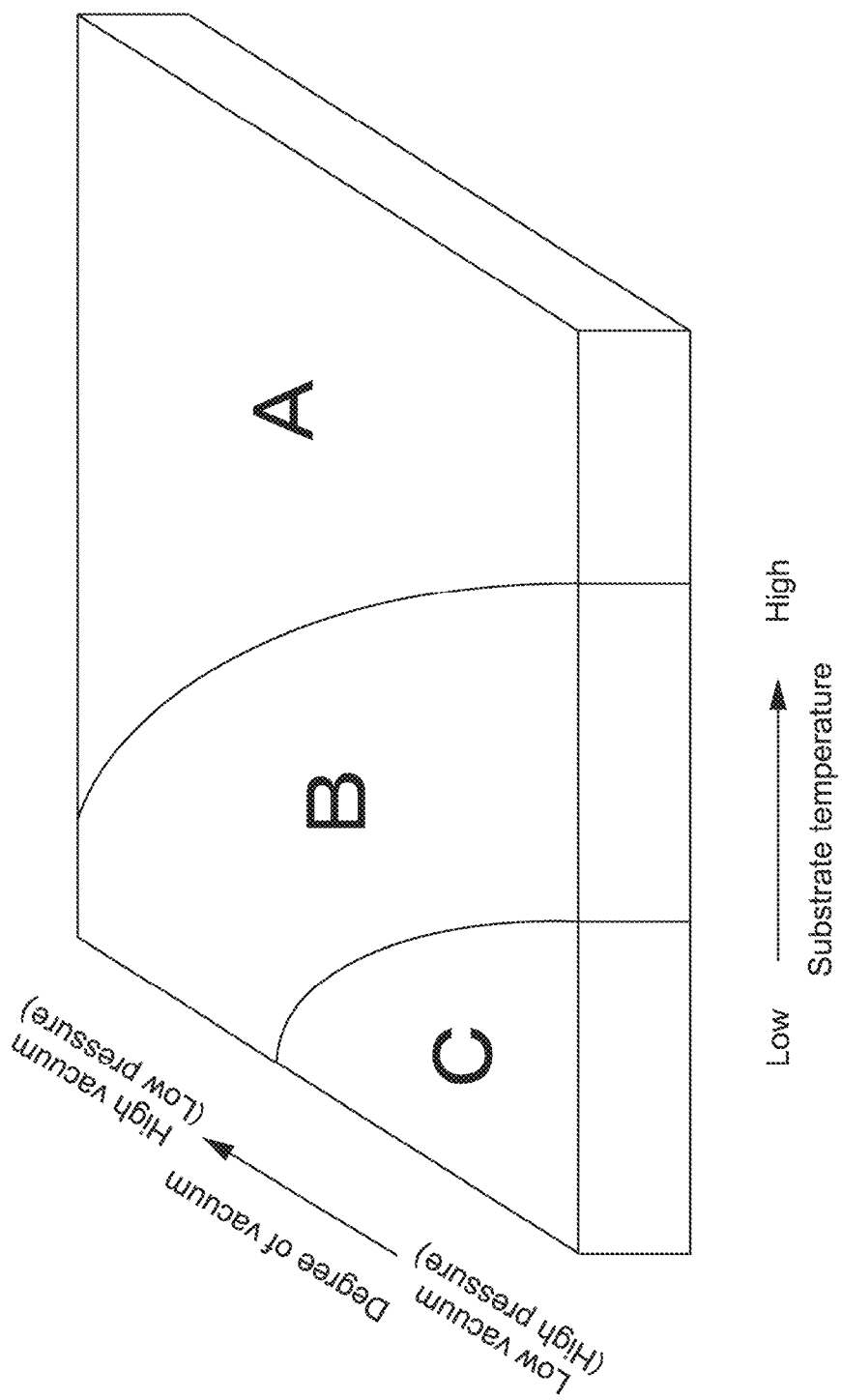
FIG. 6 A schematic diagram showing the relationship between the film temperature and degree of vacuum and the shape of a film to be the metal layer.

FIG. 6 is a schematic diagram showing the relationship between the film temperature and degree of vacuum and the shape of a film to be the metal layer 20. As shown in FIG. 6, in the case where the film temperature is high and the degree of vacuum is high (the pressure is low), a film structure A that is dense and hard and has a sticking force to the base film 10 is obtained. In the case of the film structure A, because the stretchability is maintained to be high, it is difficult to form more proper fine cracks 22 by biaxial stretching to be described later.

In the case where the film temperature is low and the degree of vacuum is low (the pressure is high), a film structure C that is a rough film full of voids and very brittle and has no adhesiveness is achieved. In the case of the film structure C, it is easy to form cracks by biaxial stretching but the outer appearance of metallic luster can be deteriorated due to the strength of the metal layer 20. Further, because the adhesiveness to the base film 19 is low, the metal layer 20 is likely to run down when forming the casing part 101 by the in-mold molding method, insert molding method, or the like.

When the film temperature and the degree of vacuum are controlled to be intermediate temperature and degree of vacuum of those described above, because growth begins with particles initially adhered to the base film 10 as a nucleus and it grows up to have a column shape (column structure), a film structure B that has a moderate hardness and adhesiveness is achieved. In the case of the film structure B, it is possible to suppress the stretchability and suitably form the fine cracks 22 by biaxial stretching, as compared with the film structure A or bulk metal. Further, because it has a proper strength and sufficient adhesiveness as compared with the film structure C, it is possible to achieve a high durability of the metal decorating part 10 and proper decoration on the casing part 101 by in-mold molding or the like.

By controlling the film temperature and the degree of vacuum to be within the intermediate range, it is possible to form the metal layer 20 having the film structure B. As the intermediate range, for example, the film temperature is within the range from approximately −30° C. to approximately 100° C., and the degree of vacuum is within the range from approximately $1 \times 10^{-4}$ Pa to approximately $1 \times 10^{-2}$ Pa. As a matter of course, it is not limited thereto, and the proper condition for making the metal layer 20 have the film structure B only needs to be properly set depending on the metal material to be deposited, for example. For example, in the case where the metal layer 20 has the film structure A, it only needs to reduce the film temperature and the degree of vacuum. Further, in the case where the metal layer 20 has the film structure C, it only needs to increase the film temperature and the degree of vacuum.

Figure 7:
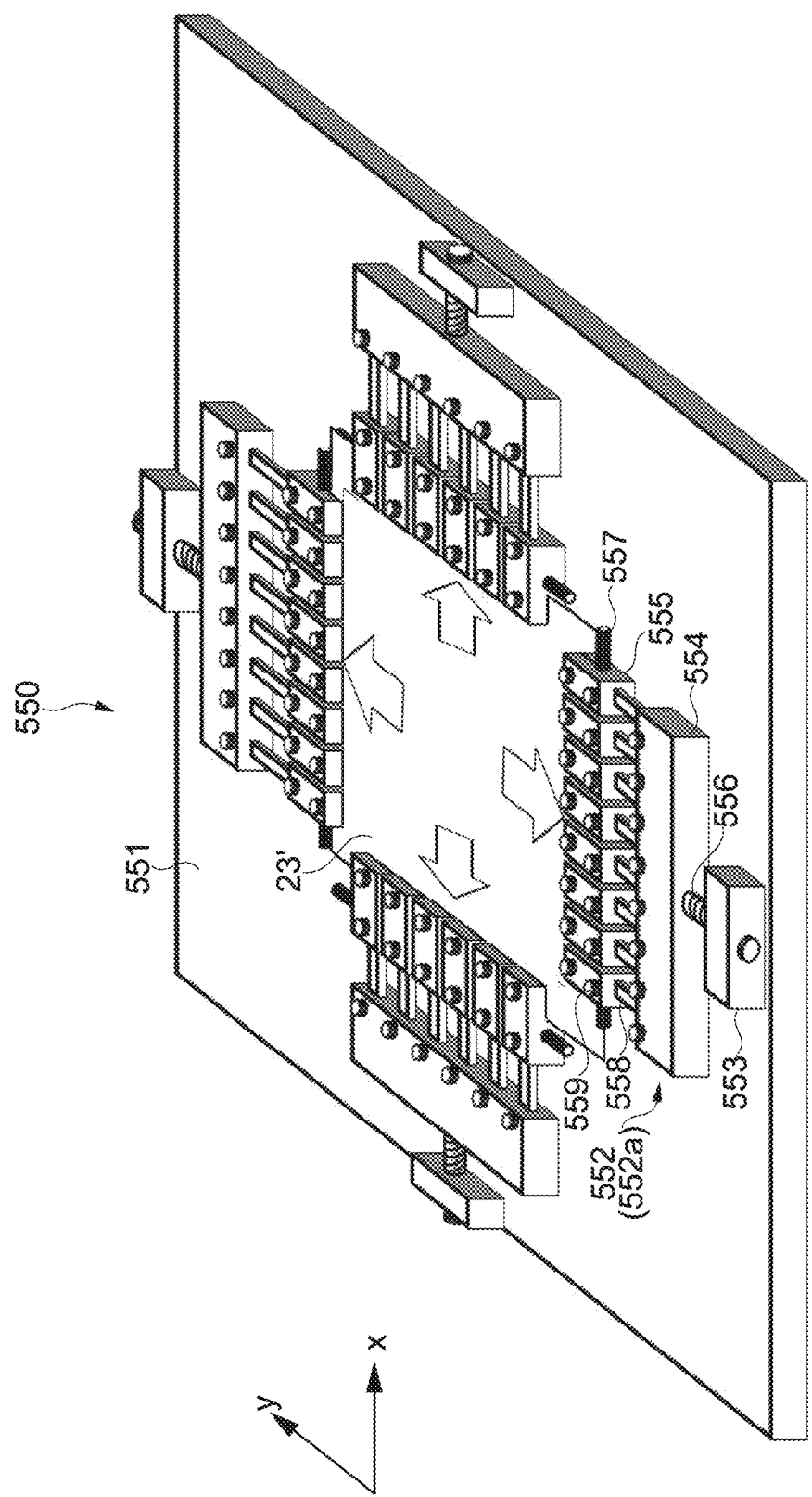
FIG. 7 A schematic view showing a configuration example of a biaxial stretching apparatus.

FIG. 7 is a schematic view showing a configuration example of a biaxial stretching apparatus. A biaxial stretching apparatus 550 includes a base member 551 and four stretching mechanisms 552 that are disposed on the base member 551 and have substantially the same configuration. Of the four stretching mechanisms 552, two mechanisms are disposed on each of two axes orthogonal to each other (the x-axis and the y-axis) so that they face with each other on each axis. Hereinafter, description will be made with reference to a stretching mechanism 552a that stretches the luster film 23' in the direction opposed to the arrow of the y-axis direction.

The stretching mechanism 552a includes a fixed block 553, a movable block 554, and a plurality of clips 555. The fixed block 553 is fixed to the base member 551. A stretching screw 556 that stretches in the stretching direction (y-direction) penetrates the fixed block 553.

The movable block 554 is movably disposed on the base member 551. The movable block 554 is connected to the stretching screw 556 that penetrates the fixed block 553. Therefore, by operating the stretching screw 556, the movable block 554 is movable in the y-direction.

The plurality of clips 555 are arranged along the direction (x-direction) orthogonal to the stretching direction. A slide shaft 557 that stretches in the x-direction penetrates each of the plurality of clips 555. The position of each clip 555 in the x-direction can be changed along the slide shaft 557. Each of the plurality of clips 555 and the movable block 554 are connected to each other by a connecting link 558 and a connecting pin 559.

By the operation amount of the stretching screw 556, the stretching percentage (stretching amount to the original size) is controlled. Further, also by appropriately setting the number or position of the plurality of clips 555, the length of the connecting pin 558, and the like, it is possible to control the stretching percentage. Note that the configuration of the biaxial stretching apparatus 550 is not limited. Although biaxial stretching is performed on a film with a full-cut sheet in the biaxial stretching apparatus 550 according to this embodiment, the biaxial stretching can be continuously performed by rolls. For example, continuous biaxial stretching can be performed by giving a tension force in the travelling direction between the rolls and a tension force orthogonal to the travelling direction by the clips 555 that are provided between the rolls and move in synchronization with the travelling.

The luster film 23' after vacuum vapor deposition is disposed on the base member 501, and the plurality of clips 555 of the stretching mechanism 552 are attached to each of the four sides. While the luster film 23' is heated by a temperature-controlled heating lamp (not shown) or temperature-controlled hot air, biaxial stretching is performed by operating the four stretching screws 556. With this, as shown in FIGS. 3A and 3B, the plurality of fine cracks 22 are formed in the metal layer 20.

Note that although the stretching percentage is not limited, typically, it is set to be within the range from approximately 2% to approximately 10%. The stretching percentage may be appropriately set on the basis of the size of the luster film 23, the stretchability of the metal material, and the like. The pitch of the fine cracks 22 to be formed is set to be within the range of not less than 1 μm and not more than 500 μm, for example, as the size that cannot be determined by the human eye although it depends on the frequency band of the antenna. It is not limited thereto, and it may be appropriately set on the basis of the designability on the outer appearance, for example.

FIGS. 8A and 8B are schematic diagrams for describing the in-mold molding method. The in-mold molding is performed by a molding apparatus 600 including a cavity mold 601 and a core mold 602 shown in FIGS. 8A and 8B. As shown in FIG. 8A, a recess portion 603 depending on the shape of the casing part 101 is formed in the cavity mold 601. A transfer film 30 is disposed so as to cover the recess portion 603. The transfer film 30 is formed by adhering the decorating film 12 shown in FIG. 2 to a carrier film 31. The transfer film 30 is supplied from the outside of the molding apparatus 600 by, for example, a roll-to-roll system.

As shown in FIG. 8B, the cavity mold 601 and the core mold 602 are clamped, and a molding resin 35 is injected in the recess portion 603 via a gate part 606 formed in the core mold 602. In the cavity mold 601, a sprue part 608 to which the molding resin 35 is supplied and a runner part 609 connected thereto are formed. When the cavity mold 601 and the core mold 602 are clamped, the runner part 609 and the gate part 606 are connected to each other. With this, the molding resin 35 supplied to the sprue part 608 is injected in the recess portion 603. Note that the configuration for injecting the molding resin 35 is not limited.

As the molding resin 35, for example, general-purpose resin such as ABS (acrylonitrile butadiene styrene) resin, PC (polycarbonate) resin, an engineering plastic such as mixed resin of ABS and PC, and the like are used. It is not limited thereto, and the material and color of the molding resin can be appropriately selected so as to obtain a desired casing part (casing component).

The molding material 375 in the state where it is melted at high temperature is injected in the recess portion 603. The molding material 35 is injected so as to press the inner surface of the recess portion 603. At this time, the transfer film 30 disposed on the recess portion 603 is deformed by being pressed by the molding resin 35. The adhesive layer 18 formed in the transfer film 30 is melted by the heat of the molding resin 35, and the decorating film 12 is adhered to the surface of the molding resin 35.

After injecting the molding resin 35, the cavity mold 601 and the core mold 602 are cooled and the clamp is released. To the core mold 602, the molding resin 35 to which the decorating film 12 is transferred is attached. By taking out the molding resin 35, the casing part 101 in which the metal decorating part 10 is formed in a predetermined region thereof is produced. Note that when the clamp is released, the carrier film 30 is peeled off.

By using the in-mold molding method, it is possible to easily match the position of the decorating film 12 and easily form the metal decorating part 10. Further, the design degree of freedom of the shape of the casing part 101 is high, and it is possible to produce the casing part 101 having various shapes.

Note that the antenna unit 15 housed in the casing part 101 may be attached by the in-mold molding method when molding the casing part 101. Alternatively, after molding the casing part 101, the antenna unit 15 may be attached to the casing part 101. Further, the casing includes the antenna unit 15 therein, in some cases.

Figure 12:
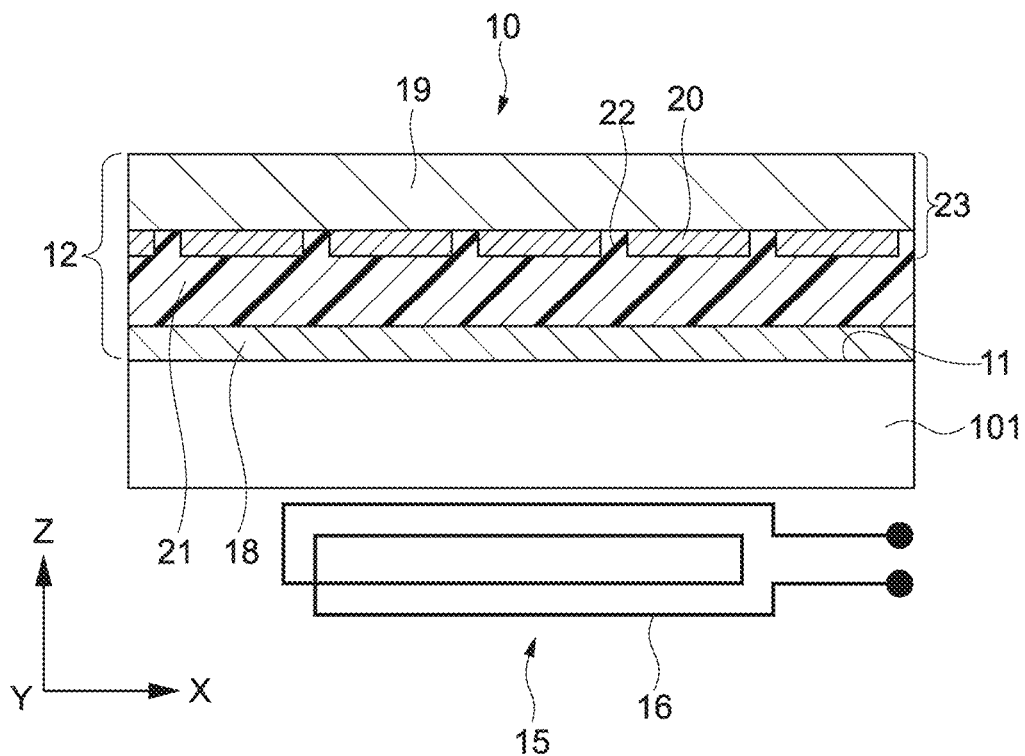
FIG. 12 A schematic diagram showing the case of adhering the decorating film with its front and back sides reversed.

As shown in FIG. 2, in this embodiment, the base film 19 and the casing part 101 are adhered via the adhesive layer 18. It is not limited thereto, and the sealing resin 21 may be adhered to the casing part 101 as shown in FIG. 12. In this case, the transparent base film 19 is used, and the sealing resin 21 may be opaque. That is, as the sealing resin 21, arbitrary colored resin may be used. With this, it is possible to improve the designability. Further, it is possible to cause the base film 19 to function as a protective layer.

FIGS. 9A and 9B are schematic diagrams for describing the insert molding method. In the insert molding, the decorating film 12 is disposed as an insert film in a cavity mold 651 of a molding apparatus 650. Then, as shown in FIG. 9B, the cavity mold 651 and a core mold 652 are clamped, and the molding resin 35 is injected in the cavity mold 651 via a gate part 656. With this, the casing part 101 is integrally formed with the decorating film 12. Also by using the insert molding method, it is possible to easily form the metal decorating part 10. Further, it is possible to produce the casing part 101 having various shapes. Note that the configuration of a molding apparatus that performs the in-mold molding and the insert molding is not limited.

The metal decorative properties and radio wave transmission properties in the case where the metal decorating part 10 according to the present technology is formed will be described. FIG. 10A is a schematic view for describing the evaluation method of radio wave transmission properties. FIG. 10B is a table showing evaluation results of radio wave transmission properties.

As samples used for this evaluation, 8 samples from a sample 1 to a sample 8 were formed. In each sample, a film of the metal layer 20 was formed by vacuum vapor deposition to have the film structure B shown in FIG. 6 by using a PET film having a thickness of approximately 100 μm as the base film 19.

As the vapor deposition condition, the deposition was performed with the degree of vacuum of the range from approximately $1 \times 10^{-3}$ Pa to approximately $1 \times 10^{-2}$ Pa and the speed of approximately 1 nm/s. At this time, the distance between the crucible 503 and the base film 19 is approximately 500 nm. The metal material of each sample is as in the table of part B of FIG. 10. Among these, the oxidized film of $TiO_2$ (titanium oxide) was formed by depositing Ti while flowing oxygen at approximately 30 sccm.

After vacuum vapor deposition, a biaxial stretching process was performed with the stretching percentage shown in FIG. 10B. Note that in the case where the stretching percentage is 0%, the stretching process was not performed (sample 1). In each of these samples, high designability in which light could be reflected with high reflectance was confirmed.

As shown in FIG. 10A, a network analyzer (high frequency circuit) 70 was used for evaluation of radio wave transmission properties. A reflected power terminal 71 and a passing power terminal 72 of the network analyzer 70 are placed at both ends of a waveguide 73 having a diameter of 100 mm and a length of 260 mm. At the center portion of the waveguide 73, an aperture 75 in which a square hole 74 having an opening whose size is 40 mm×40 mm is formed is disposed.

Each of the samples was sandwiched by this aperture 75, and radio wave transmission properties thereof were evaluated. In this embodiment, as the evaluation value of radio wave transmission properties, the attenuation rate at 2.45 GHz generally utilized by WiFi and the like was calculated. As shown in FIG. 10B, the value of the attenuation rate obtained by subtracting, as a reference, the value at the time when the sample is not put is displayed as dB. As the attenuation rate is closer to 0 dB, radio wave transmission properties are high. As the value of minus is increased, radio wave transmission properties are low.

The sample 1 is a Co film that has a thickness of 20 nm and is not stretched. In this sample 1, the surface resistance and radio wave attenuation rate are respectively 22 Ω/cm and −9.3 dB, and radio wave transmission properties are low.

The sample 2 is Co film that has the same thickness and is stretched in the x and y directions by approximately 3%. In this sample 2, the surface resistance was infinite and the radio wave attenuation rate was −0.5 dB. That is, very high radio wave transmission properties were exerted. The outer appearance thereof is dark metallic that is substantially the same as that of the sample 1 that is not stretched, and it is sufficiently possible to decorate it with metal luster.

Figure 11:
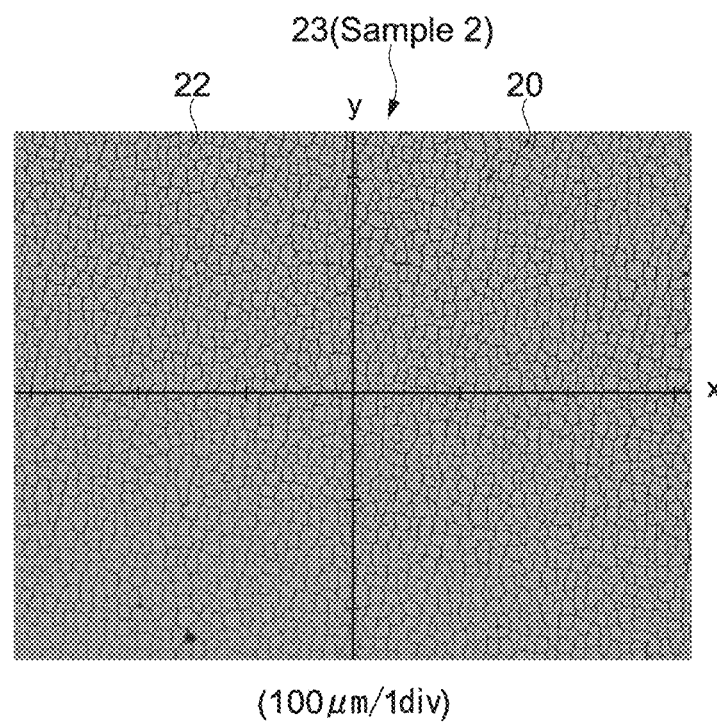
FIG. 11 A photograph obtained by enlarging and imaging the surface state of a sample 2 by a microscope.

FIG. 11 is a photograph obtained by enlarging and imaging the surface state of the sample 2 by a microscope. This photograph is imaged so as to include the x-axis and the y-axis shown in FIG. 11. However, each line is reinforced on the photograph and illustrated to make it easy to recognize the axes and scale part.

The size of one scale of the x-axis and the y-axis shown in FIG. 11 is approximately 100 μm. Therefore, it can be seen that the fine cracks 22 are formed in the metal layer 20 of the sample 2 in the biaxial direction at the pitch of approximately 10 μm. Note that the crack size (μm) shown in FIG. 10B corresponds to the pitch of the fine cracks 22.

The sample 4 is an Al film having a thickness of 64 nm in which biaxial stretching is performed. As shown in FIG. 10B, the fine cracks 22 are properly formed in the biaxial direction at the pitch of approximately 15 μm, and the radio wave attenuation rate is very high, i.e., −0.1 dB.

These Al, Ti, and the like are each a metal having brightness and luster, and are a very useful metal material for realizing metal luster. However, because Al, Ti, and the like have high stretchability, it has been difficult to form the fine cracks 22 by the conventional technology. In the present technology, the stretchability can be suppressed by forming the metal layer 20 to have a frost-column structure in vapor deposition. Therefore, also in the case where a metal material having high stretchability such as Al and Ti is used, it is possible to suitably form the fine cracks 22 by a biaxial stretching process. As a result, it has become possible to exert high radio wave transmission properties while having a very favorable outer appearance of metal luster.

The sample 4 is a two-layer film of Co and Al. Even with such a two-layer structure, it is possible to form the luster film 23 having proper radio wave transmission properties. With this, it is possible to increase the variation of metal luster and further improve the designability. Note that according to the present technology, it is possible to realize high radio wave transmission properties even with a laminate structure of three or more layers.

In the samples 5 to 8, colors are generated by using interference of a Ti film surface and $TiO_2$ film light with a two-layer structure of Ti+TiO$_2$. Even with a decoration film of metal+an oxidized film, it is possible to exert high radio wave transmission properties by using the present technology. As shown in FIG. 10B, it is possible to achieve various kinds of metal luster and improve the designability by adjusting the thickness of TiO$_2$.

As described above, as the metal layer 20, those having a laminate structure in which a metal layer or an oxidized metal layer is laminated may be formed. Even in the case where a layer of any of Al, Al$_2$O$_3$ (aluminum oxide), Ti, TiO$_2$, and an alloy containing at least one of them is included, it is possible to exert high radio wave transmission properties.

As described above, in this embodiment, the decorating film 12 is adhered to the decorated region 11 of the casing part 101. In the decorating film 12, the metal layer 20 is formed in the base film 19 by vacuum vapor deposition, and the fine cracks 22 are formed in the metal layer 20 by performing biaxial stretching on the base film 19.

Since a film of the metal material is formed by vacuum vapor deposition, a material such as Al and Ti that are hard to deposit on resin by a wet plating such as an electroless plating can be used. Therefore, the selection range of the usable metal material is very large. Further, since the fine cracks 22 are formed by biaxial stretching, it is possible to form the metal layer 20 with high adhesiveness in vacuum vapor deposition. As a result, the metal layer 20 does not run down at the time of in-mold molding and insert molding, and it is possible to properly mold the casing part 101. Further, it is possible to improve also the durability of the metal decorating part 10 itself.

Further, since the metal layer is formed to have a frost-column shape in vacuum vapor deposition and the stretchability is suppressed, a metal material having high stretchability such as Al, Ti, Ag, Au, and Sn can be used. Also in this point, the selection range of the metal material is significantly widened, and it is possible to form the casing part 101 to have a desired metal outer appearance. As a result, it is possible to realize a casing component that is capable of transmitting a radio wave therethrough and has high designability while having metal outer appearance.

Further, although the vacuum film deposition method has been conventionally a high-cost processing method, in this embodiment, it is possible to continuously perform deposition on a film by a roll-to-roll system, greatly. Therefore, it is possible to significantly reduce the cost and achieve an improvement in the productivity.

In the above-mentioned indium foil having radio wave transmission properties, the radio wave transmission properties are realized by the discontinuous film of indium. However, in this indium foil, because the film thickness is low, sufficient reflectance is not achieved, it darkens, and the designability of metal decoration is very low. Further, because indium is a rare metal, it takes a material cost.

Also a method of forming a discontinuous film by adding stress to a metal-plated film and causing cracks to be formed is conceivable. However, a metal material that can be deposited by wet plating is limited. In particular, Al, Ti, Zn, and the like cannot cover resin by electroless plating. Further, there is an environment problem such as waste liquid processing.

Also a method of forming a discontinuous film by fine pattern etching is conceivable. However, this leads to cost increase because processes of resist application, exposition, etching, washing, and resin sealing are added.

In contrast, the following various effects can be exerted with the casing part including the metal decorating part according to the present technology.

It is possible to improve radio wave transmission properties while improving the design additional value by metal decoration.

The selectability of texture is wide because substantially all metals can be used by vapor deposition and the like.

Even with the metal material having high stretchability, it is possible to realize crystalline miniaturization, frost-column growth structure, voids between fine columns, and the like by sufficiently cooling the base film 19 to control the vapor deposition condition. As a result, because the structure (structure in which the stretchability is suppressed) in which the fine cracks 22 are easily formed is easily realized in biaxial stretching, it is possible to perform decoration with radio wave transmission properties.

Because it is possible to improve the luster and reflectance as compared with conventionally used one, it is possible to realize a high additional value.

Because it is possible to easily form the luster film 23 by a mass-productive process such as a roll-to-roll system, it is very advantageous in mass production and cost reduction.

Because it can be formed without performing a masking process or an etching process, it is possible to realize cost reduction and prevent toxic waste from being generated.

Because it is possible to easily form a protective layer that protects the metal layer 20 at the outermost part, (e.g., sealing resin 21 in FIG. 2), it is possible to suppress the defect such as peeling of the metal layer 20, and prevent the metal layer 20 from wear down due to long-term use. As a result, it is possible to maintain the outer appearance quality. Further, it is possible to realize new design expression of metal+coloring by coloring the protective part.

Because it is possible to easily form the resinous casing part 101, the weight saving of commodities can be achieved.

The present technology is applicable to substantially all electronic apparatuses in which an internal antenna and the like are housed. Examples of such an electronic apparatus include electronic apparatuses such as a mobile phone, a smartphone, a personal computer, a game console, a digital camera, audio equipment, a TV, a projector, a car navigation system, a GPS terminal, a digital camera, and wearable information equipment (eyeglass-type, wrist band-type), operation equipment that operates these electronic apparatuses through wireless communication, such as a remote controller, a mouse, and a touch pen, and electronic apparatuses provided in a vehicle, such as a car-mounted radar and a car-mounted antenna.

Note that the effects described in the present disclosure including the effects listed in the above are merely examples and are not limited, and additional effects may be provided. The description of the plurality of effects does not represent that these effects are necessarily simultaneously exerted. It represents that at least any of the above-mentioned effects is acquired depending on the condition and the like. An effect that is not described in the present disclosure may be exerted.

Other Embodiments

The present technology is not limited to the above-mentioned embodiment, and can achieve other various embodiments.

Figure 13A:
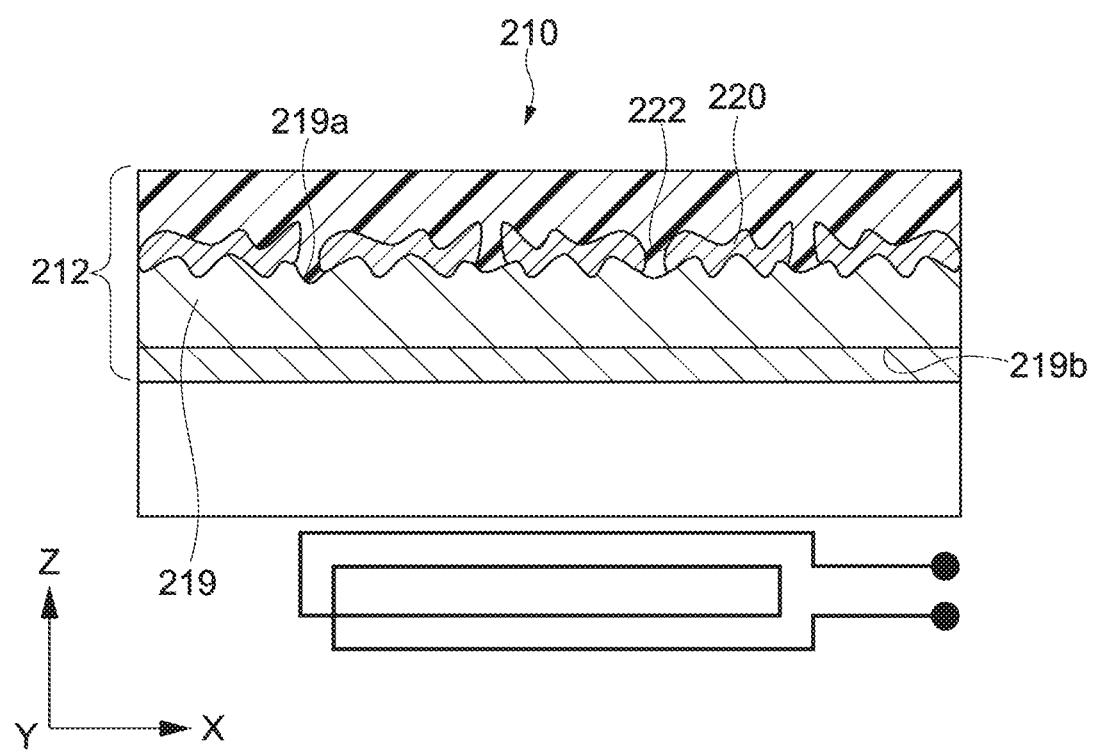
FIGS. 13A and 13B The schematic diagrams showing another configuration example of the metal decorating part.
Figure 13B:
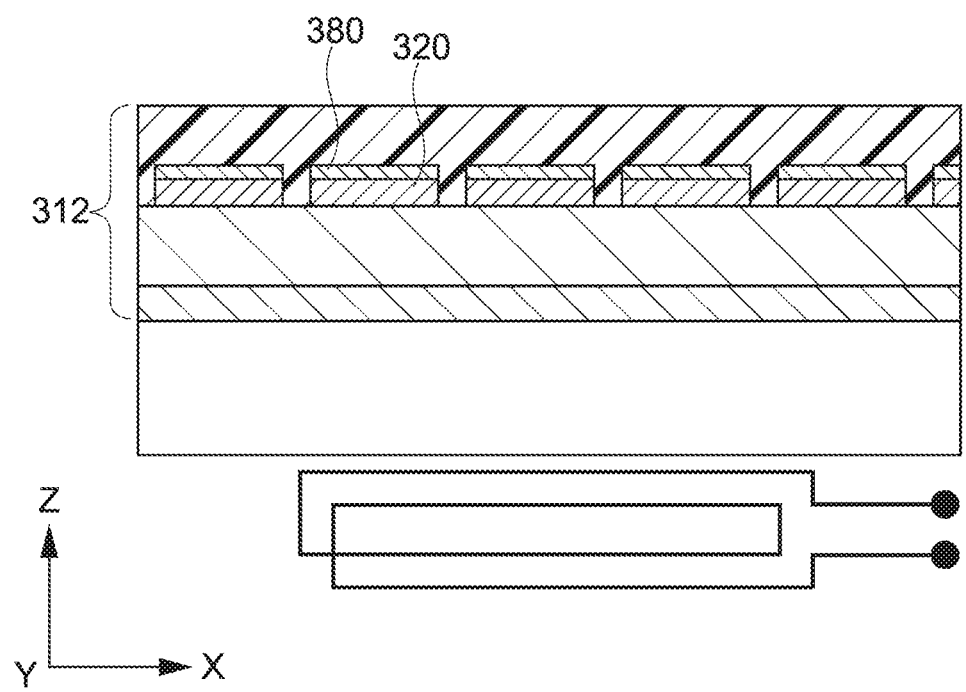

FIGS. 13A and 13B are schematic diagrams showing another configuration example of the metal decorating part. In a metal decorating part 210 shown in FIG. 13A, convex and concave processing is performed on a base film 219 in a decorating film 212, and a metal layer 220 is formed on a convex and concave surface 219a by vacuum vapor deposition. Then, after that, fine cracks 222 are formed by biaxial stretching. With this, also the surface of the metal layer 220 has a convex and concave shape depending on the concavity and convexity of the base film 210. As a result, the metal decorating part 210 can be a design such as hair line processing and blast processing of metal processing finishing. By changing the shape, dimensions, and the like of the convex and concave, it is possible to change the texture of the metal decorating part 210. Note that also in the case where the metal layer 220 is formed on a surface 219b opposite to the convex and concave surface 219a, the same effects can be achieved.

In a metal decorating part 310 shown in FIG. 13B, an oxidized film 380 is formed as an optical interference film on a metal layer 320 in a decorating film 312. This is the configuration that corresponds to the two-layer structure of $Ti+TiO_2$ of the samples 5 to 8 shown in FIG. 10B, and it is possible to exert high designability. For example, depending on the angle of viewing the metal decorating part 310, it is also possible to achieve the structure in which the color shade, texture, and the like are changed. This can be achieved also by appropriately setting the convex and concave shape of the base film 219 or the material or thickness of a contact resin 221.

Figure 14A:
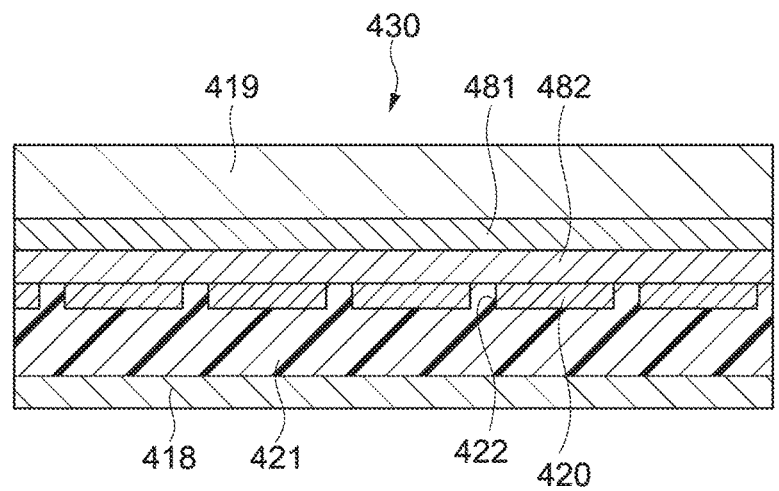
FIGS. 14A and 14B The diagrams showing a configuration example of a transfer film including the base film and the metal layer.
Figure 14B:
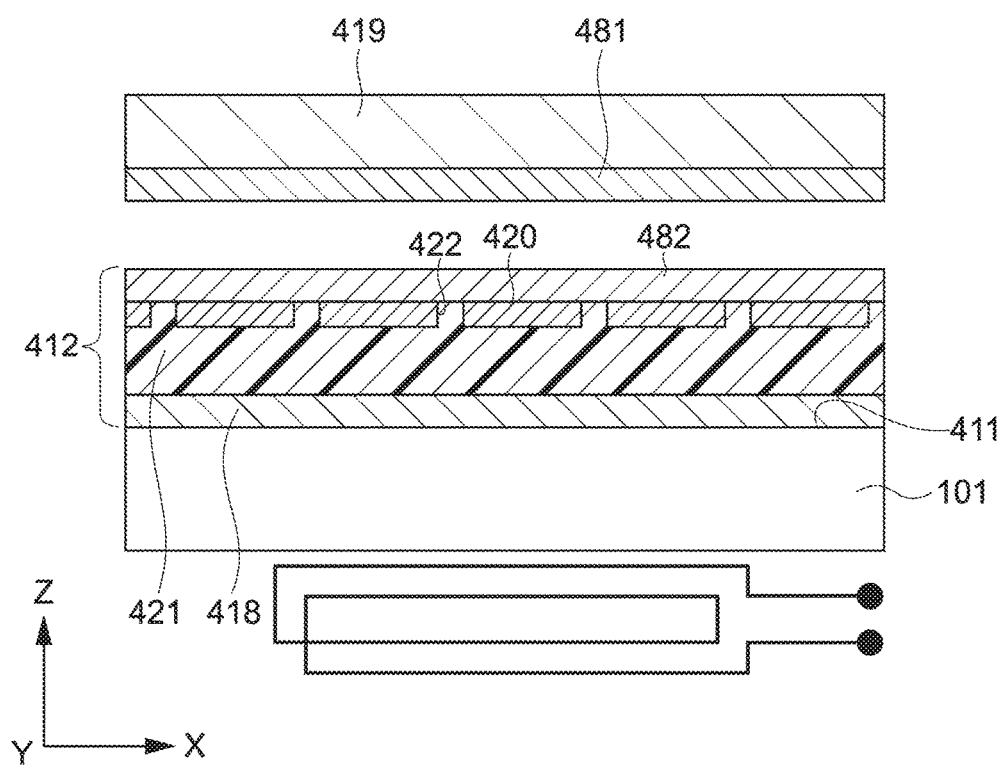

FIGS. 14A and 14B are schematic diagrams showing a configuration example of a transfer film including the base film and the metal layer. A transfer film 430 includes a base film 419, a removed layer 481, a hard coat layer 482, a metal layer 420, a contact resin 421, and an adhesive layer 418. The removed layer 481 and the hard coat layer 482 are formed on the base film 419 in the stated order.

Therefore, the metal layer 420 is formed on the base film 419 in which the removed layer 481 and the hard coat layer 482 are formed. Then, by stretching the base film 419, the fine cracks 422 are formed in the metal layer 420.

As shown in FIG. 14B, when the casing part 101 is formed by the in-mold molding method, the base film 419 and the removed layer 481 are peeled off and the decorating film 412 including the metal layer 420 is adhered to the decorated region 411. As described above, the base film 419 may be used as a carrier film. Note that the base film 419 in which the removed layer 481 and the hard coat layer 482 are formed can be regarded as the base film according to the present technology.

In the above, with the frost-column structure, the restriction structure that restricts the stretchability of the metal layer has been realized. It is not limited thereto, and the restriction structure may be realized with another configuration. For example, a structure in which a metal material constituting the metal layer is mixed with an impurity may be employed as the restriction structure. For example, by forming the metal layer with a material mixed with 1% or more of impurity instead of pure metal, it is possible to suppress the stretchability as compared with the case where the metal layer is formed of pure metal. Further, also by forming a metal oxidized layer as a base of the metal layer, it is possible to suppress the stretchability. Note that in the case of metal having low stretchability, the restriction structure does not need to be formed. Also in this case, it is possible to form the decorating film according to the present technology by vacuum vapor deposition and biaxial stretching.

In the above, as shown in FIGS. 3A and 3B and the like, the curved fine column 25 are formed. It is not limited thereto, and fine columns may be formed in the base film fixed on the plane surface by vacuum vapor deposition. In this case, fine particles of the metal material linearly grow, and fine columns that extend in one direction are formed. As a matter of course, the luster film 23 may be formed by batch deposition processing.

In the above, the casing part has been molded by in-mold molding and insert molding. It is not limited thereto, and the casing component including the metal decorating part according to the present technology may be molded by vacuum molding or pressure molding.

The stretching for forming the fine cracks 22 is not limited to biaxial stretching. Uniaxial stretching or tri- or more axial stretching may be performed. Further, biaxial stretching may be further performed on the base film 19 taken up by the take-up roll 507 shown in FIG. 4 by a roll-to-roll system. Further, after vacuum vapor deposition is performed, biaxial stretching may be performed before it is taken up by the take-up roll 507.

In the above, the decorating film 12 is adhered to the casing part 101 by the in-mold molding method or insert molding method. It is not limited thereto, and the decorating film 12 may be adhered to the casing part 101 by another method such as thermal transfer and pasting. That is, by using the transfer films 30 and 430 shown in FIGS. 8A and 8B and FIGS. 14A and 14B, the casing part having the decorated region to which the decorating film including the metal layer is transferred may be formed by a hot stamping method.

At least two feature parts of the feature parts of the embodiments can also be combined. That is, various feature parts described in each embodiment may be arbitrarily combined without distinguishing the embodiments with each other.

Note that, the present technology may also take the following configurations.

(1) A casing component, including:
a decorating film including a metal layer, the metal layer being formed on a base film by vapor deposition, fine cracks being formed in the metal layer by stretching the base film; and
a casing part having a decorated region, the decorating film being adhered to the decorated region.

(2) The casing component according to (1), in which the decorating film includes a base film in which the metal layer is formed.

(3) The casing component according to (1) or (2), in which
the fine cracks are formed by performing biaxial stretching on the base film.

(4) The casing component according to any one of (1) to (3), in which
the metal layer has a restriction structure that restricts stretchability.

(5) The casing component according to (4), in which
the restriction structure is a structure in which a metal material constituting the metal layer has a frost-column shape.

(6) The casing component according to (4) or (5), in which
the metal layer is formed on the base film by vacuum vapor deposition, and
the restriction structure is formed by performing the vacuum vapor deposition under a predetermined temperature condition and a predetermined pressure condition.

(7) The casing component according to claim 6), in which the metal layer is formed by performing vacuum vapor deposition on the base film transported along a peripheral surface of a rotating drum from an unwind roll to a take-up roll.

(8) The casing component according to any one of (4) to (7), in which
the metal layer is formed of any of aluminum, titanium, and an alloy containing at least one of them.

(9) The casing component according to any one of (4) to (7), in which
the metal layer has a laminate structure, a metal layer or an oxidized metal layer is laminated in the laminate structure.

(10) The casing component according to (9), in which
the metal layer includes a layer of any one of aluminum, aluminum oxide, titanium, titanium oxide, and an alloy containing at least one of them.

(11) The casing component according to any one of (1) to (10), in which
the fine cracks are formed at a pitch of not less than 1 μm and not more than 500 μm.

(12) An electronic apparatus, including:
a decorating film including a metal layer, the metal layer being formed on a base film by vapor deposition, fine cracks being formed in the metal layer by stretching the base film;
a casing part having a decorated region, the decorating film being adhered to the decorated region; and
an electronic component housed in the casing part.

(13) The electronic apparatus according to (12),
the electronic component includes an antenna unit disposed in the decorated region.

(14) A manufacturing method for a casing component, including:
forming a metal layer on a base film by vapor deposition, and forming fine cracks in the metal layer by stretching the base film;
forming a decorating film including the metal layer in which the fine cracks are formed;
forming a transfer film by adhering a carrier film to the decorating film; and
forming a molding part so that the decorating film is transferred from the transfer film by an in-mold molding method or a hot stamping method.

(15) A manufacturing method for a casing component, including:
forming a metal layer on a base film to be a carrier film by vapor deposition, and forming fine cracks in the metal layer by stretching the base film;
forming a transfer film including the base film and the metal layer; and
forming a molding part so that the metal layer is transferred from the transfer film by an in-mold molding method or a hot stamping method.

(16) A manufacturing method for a casing component, including:
forming a metal layer on a base film by vapor deposition, and forming fine cracks in the metal layer by stretching the base film;
forming a decorating film including the metal layer in which the fine cracks are formed; and
forming a molding part integrally with the decorating film by an insert molding method.

(17) The manufacturing method for the casing component according to any one of (14) to (16), in which
the forming of the metal layer includes performing vacuum vapor deposition under a predetermined temperature condition and a predetermined pressure condition so that a metal material constituting the metal layer has a frost-column shape.

REFERENCE SIGNS LIST 10, 210, 310 metal decorating part
11, 411 decorated region
12, 212, 312, 412 decorating film
15 antenna unit
19, 219, 419 base film
20, 220, 320, 420 metal layer
22, 422 fine cracks
25 fine columns
30, 430 transfer film
31 carrier film
90 metal material
100 portable terminal
101 casing part
500 vacuum deposition apparatus
550 biaxial stretching apparatus
600, 650 molding apparatus

The invention claimed is:

1. A manufacturing method, comprising:
forming a metal layer on a base film by vacuum vapor depositioning under a specific temperature condition and a specific pressure condition so that the metal layer comprising a metal material has a frost-column shape,
wherein the frost-column shape of the metal layer corresponds to a restriction structure that suppresses stretchability of the metal layer;
forming a plurality of fine cracks in the metal layer by biaxially stretching the base film;
forming a decorating film including the metal layer;
forming a transfer film by adhering a carrier film to the decorating film; and
forming a molding part so that the decorating film is transferred from the transfer film to a molding resin by one of an in-mold molding method or a hot stamping method.

2. A manufacturing method, comprising:
forming a metal layer on a base film by vacuum vapor depositioning under a specific temperature condition and a specific pressure condition so that the metal layer comprising a metal material has a frost-column shape,
wherein the frost-column shape of the metal layer corresponds to a restriction structure that suppresses stretchability of the metal layer;
forming a plurality of fine cracks in the metal layer by biaxially stretching the base film;
forming a transfer film including the base film and the metal layer; and
forming a molding part so that the metal layer is transferred from the transfer film to a molding resin by one of an in-mold molding method or a hot stamping method.

3. A manufacturing method, comprising:
forming a metal layer on a base film by vacuum vapor depositioning under a specific temperature condition and a specific pressure condition so that the metal layer comprising a metal material has a frost-column shape, wherein the frost-column shape of the metal layer corresponds to a restriction structure that suppresses stretchability of the metal layer;

forming a plurality of fine cracks in the metal layer by biaxially stretching the base film;

forming a decorating film including the metal layer; and forming a molding part integrally with the decorating film by an insert molding method.

4. The manufacturing method according to claim 1, wherein
the specific temperature condition for the vacuum vapor depositioning corresponds to a temperature within a range from approximately −30° C. to approximately 100° C., and
the specific pressure condition for the vacuum vapor depositioning corresponds to a degree of vacuum within a range from approximately $1 \times 10^{-4}$ Pa to approximately $1 \times 10^{-2}$ Pa.

5. The manufacturing method according to claim 1, wherein a first axis associated with the biaxial stretching of the base film is orthogonal to a second axis associated with the biaxial stretching of the base film.

6. A manufacturing method, comprising:
forming a metal layer on a base film by vacuum vapor depositioning under a specific temperature condition and a specific pressure condition so that the metal layer comprising a metal material has a frost-column shape, wherein
the specific temperature condition for the vacuum vapor depositioning corresponds to a temperature within a range from approximately −30° C. to approximately 100° C., and
the specific pressure condition for the vacuum vapor depositioning corresponds to a degree of vacuum within a range from approximately $1 \times 10^{-4}$ Pa to approximately $1 \times 10^{-2}$ Pa;

forming a plurality of fine cracks in the metal layer by biaxially stretching the base film;

forming a decorating film including the metal layer;

forming a transfer film by adhering a carrier film to the decorating film; and forming a molding part so that the decorating film is transferred from the transfer film to a molding resin by one of an in-mold molding method or a hot stamping method.

* * * * *